US 6,301,104 B1

(12) United States Patent
Hu

(10) Patent No.: US 6,301,104 B1
(45) Date of Patent: Oct. 9, 2001

(54) INTERFACE CARD-TYPE MOTHERBOARD FOR A COMPUTER

(75) Inventor: Ta-Shin Hu, Taipei (TW)

(73) Assignee: FriendTech Computer Co., Ltd., Taipei (TW)

( * ) Notice: Subject to any disclaimer, the term of this patent is extended or adjusted under 35 U.S.C. 154(b) by 0 days.

(21) Appl. No.: 09/397,824

(22) Filed: Sep. 17, 1999

(30) Foreign Application Priority Data

Jul. 9, 1999 (TW) .............................. 88211460 U

(51) Int. Cl.[7] ........................................ G06F 1/16
(52) U.S. Cl. ................. 361/684; 361/686; 361/788; 361/784; 361/803
(58) Field of Search ................................ 361/684, 686, 361/784, 788, 803

(56) References Cited

U.S. PATENT DOCUMENTS 6,147,863 * 11/2000 Moore et al. ..................... 361/686

* cited by examiner

*Primary Examiner*—Leo P. Picard
*Assistant Examiner*—Yean-Hsi Chang
(74) *Attorney, Agent, or Firm*—Thorp Reed & Armstrong, LLP

(57) ABSTRACT

An interface card-type motherboard containing a CPU, chipset, and memories. The interface card-type motherboard can be directly plugged to the original motherboard of a computer so as to upgrade the computer, whereby the computer can execute new software and connect with new peripheral devices.

7 Claims, 8 Drawing Sheets

| VCC2 Voltage | Pins 1 | Pins 2 | Pins 3 | Pins 4 | Pins 5 |
|---|---|---|---|---|---|
| 3.5V | ON | ON | ON | ON | OFF |
| 3.4V | OFF | ON | ON | ON | OFF |
| 3.3V | ON | OFF | ON | ON | OFF |
| 3.2V | OFF | OFF | ON | ON | OFF |
| 3.1V | ON | ON | OFF | ON | OFF |
| 3.0V | OFF | ON | OFF | ON | OFF |
| 2.9V | ON | OFF | OFF | ON | OFF |
| 2.8V | OFF | OFF | OFF | ON | OFF |
| 2.7V | ON | ON | ON | OFF | OFF |
| 2.6V | OFF | ON | ON | OFF | OFF |
| 2.5V | ON | OFF | ON | OFF | OFF |
| 2.4V | OFF | OFF | ON | OFF | OFF |
| 2.3V | ON | ON | OFF | OFF | OFF |
| 2.2V | OFF | ON | OFF | OFF | OFF |
| 2.1V | ON | OFF | OFF | OFF | OFF |
| 2.0V | OFF | OFF | OFF | OFF | OFF |
| 2.05V | ON | ON | ON | ON | ON |
| 2.00V | OFF | ON | ON | ON | ON |
| 1.95V | ON | OFF | ON | ON | ON |
| 1.90V | OFF | OFF | ON | ON | ON |
| 1.85V | ON | ON | OFF | ON | ON |
| 1.80V | OFF | ON | OFF | ON | ON |
| 1.75V | ON | OFF | OFF | ON | ON |
| 1.70V | OFF | OFF | OFF | ON | ON |
| 1.65V | ON | ON | ON | OFF | ON |
| 1.60V | OFF | ON | ON | OFF | ON |
| 1.55V | ON | OFF | ON | OFF | ON |
| 1.50V | OFF | OFF | ON | OFF | ON |
| 1.45V | ON | ON | OFF | OFF | ON |
| 1.40V | OFF | ON | OFF | OFF | ON |
| 1.35V | ON | OFF | OFF | OFF | ON |
| 1.30V | OFF | OFF | OFF | OFF | ON |

FIG. 7

INTERFACE CARD-TYPE MOTHERBOARD FOR A COMPUTER

BACKGROUND OF THE INVENTION

1. Field of the Invention

The present invention relates to a motherboard used in a computer, more particularly, to a card-type motherboard having a central processing unit (CPU), chipset, memories and the like. The card-type motherboard can be plugged to the original motherboard of a computer to upgrade the computer, so that the computer can execute new software and connect to new peripheral equipment.

2. Description of Related Art

To meet the requirements of high-speed data processing and to comply with new software, the speed of a CPU has to be faster and faster. As the speed of the CPU becomes high, the chipsets, I/O chip, memories and other peripheral equipment must have higher speed to be compatible with the CPU.

However, prior computers were designed under some limits and specifications at that time. Accordingly, those computers cannot meet the requirements of speed for data processing, the requirements of efficiency for executing software, and the requirements for connecting multimedia devices and other new peripheral devices. As a result, a user suffers from trouble when the user attempts to upgrade the computer.

To upgrade a computer, the points to be considered are listed as follows:

Motherboard: Prior computer systems include various types, such as LPX, AT, Baby AT, NLX. However, there are no motherboards designed for use in those old computer systems today. It is possible that a currently available motherboard cannot be directly mounted to an old computer. Accordingly, the owner of the old computer cannot upgrade the computer by replacing the motherboard. Furthermore, even a motherboard can be used in the old computer, tile current motherboard provides ATX power connector only. Therefore, prior AT power connector cannot be used. In addition, it is difficult and troublesome to replace a motherboard. To replace the motherboard, all of the devices of the computer system must be removed first, and then the fasteners for securing the original motherboard have to be screwed out. A new motherboard then is mounted to the housing of the computer. All of tile flat cables must be plugged into corresponding sockets. Any mistake of installation will cause an unstable state or even down state of tile computer.

CPU: There are limits on upgrading a CPU. Such as 80286, 80386. 80486. Pentium. It is difficult for a user to upgrade the CPU, such as to upgrade an 80286 CPU to an 80386 CPU. In addition, most of the users do not know whether the computer can use another CPU, which is of the same grade of the original CPU but has higher speed, or not. For example, the operation voltage of 80486DX-33 is +5V, 80486DX-100 is +3.3V. Pentium 75 is a single voltage CPU, while Pentium MMX, K6, K6-2, MII are dual voltage CPU's. Since the operation voltages are different, the motherboard may not use a CPU of the same grade but having higher speed. Although some motherboards can support the operation voltage of the CPU to be used, the motherboards do not provide frequency adjustment for the CPU. Therefore, it is still not possible to use the new CPU.

Chipset: The chipset is used as a bridge between peripheral interfaces, memories and CPU. Present chipsets can support memories with high speed and high capacity, AGP interface arid I/O interfacet and provide high external frequency (100/133 MHz).

Memory: Prior computers may support only tip to 16 MB because of the cihipset and CPU addressing. Such as 80486, 80386 and 80286. In addition, only the old type Fast Page DRAM can be used. The memory module may be SIMM with 72 pins, SIMM with 30 pins, or DIP packaged memory IC. Those types of memories have low speed, and are difficult to get today.

VGA card: Now a day, software and video games are presented through 3D form. In addition to a high-speed CPU with high speed, the DVD decompression of software requires a high-speed VGA chip, high-speed video memory and high-speed AGP interface. However, many old computers have no AGP interface sockets, but have only PCI interface sockets. The computers below 486-grade only have ISA interface sockets. Accordingly, those old computers cannot use new AGP video display board.

I/O interface: Old computers (below 486) support the hard disk only to 540 MB. However, current hard disks are almost above 4.3 GB, and have the function of supporting Ultra DMA. In addition, current system programs (e.g. Window 95/98/NT) require a large capacity of hard disk. Furthermore, new peripheral devices such as printer, digital camera, scanner and mouse use USB ports, 1394 ports and the like. Therefore, old computers cannot use those new peripheral devices.

Environment protection: All computer manufacturers hope consumers to eliminate old computers and buy new ones. However, there is no satisfactory method provided for computer recycle. Sometimes, a computer is cast away only because its motherboard lacks some new functions, or because the processing speed of its CPU does not meet the requirements. The elimination of those computers is a waste of resources.

In addition to update elements to upgrade a computer, interface card are often used to supplement the functions of the computer. However, there are limits on the applications and developments of interface cards. In general the computer provides a certain power to ISA sockets, PCI sockets and AGP sockets. When the chips, memories and other IC's on the interface card consume power more than the computer can load, the interface card will be unstable, or even cannot be used. Therefore, current inter face cards are designed to provide some functions that the motherboard lacks but not able to be used to upgrade the computer.

As can be seen from the above, old computers cannot satisfy current requirements because of the processing speed, software supporting capability and connection with new peripheral devices. Even the old computer is upgrades by using a interface card or CPU, the whole efficiency is limited by the motherboard, because the motherboard of the old computer may have the external frequency of only 66 MHz or 33 MHz.

SUMMARY OF THE INVENTION

One object of the present invention is to provide an interface card-type motherboard containing a CPU, chipset, and memories. The interface card-type motherboard can be directly plugged to the original motherboard of a computer so as to upgrade the computer, whereby the computer can execute new software and connect with new peripheral devices.

In accordance with one aspect of the present invention, the interface card-type motherboard is constructed as an interface card. The interface card-type motherboard comprises a CPU, chipset, memories, I/O chip, sound chip, video chip and various I/O connecting ports such as hard disk, floppy disk, CD-ROM parallel port, serial port, USB port, P/S mouse port, keyboard port, sound and VGA port. The interface card-type motherboard can be plugged to the original motherboard of the computer to upgrade the computer.

In accordance with another aspect of the present invention, the interface card-type motherboard provides various operating voltages. In addition to the power supplied by the original motherboad of the computer, the interface card-type motherboard comprises an individual power device. Different operating voltages are generated and supplied to each of the chips, memories, IC's and CPU by the power device.

Other objects, advantages and novel features of the invention will become more apparent from the following detailed description when taken in conjunction with the accompanying drawings.

BRIEF DESCRIPTION OF THE DRAWINGS

FIG. 7 is a table showing the operating voltages generated by the power device of the interface card-type motherboard of the preferred embodiment in accordance with the present invention.

DETAILED DESCRIPTION OF PREFERRED EMBODIMENT

Figure 1:
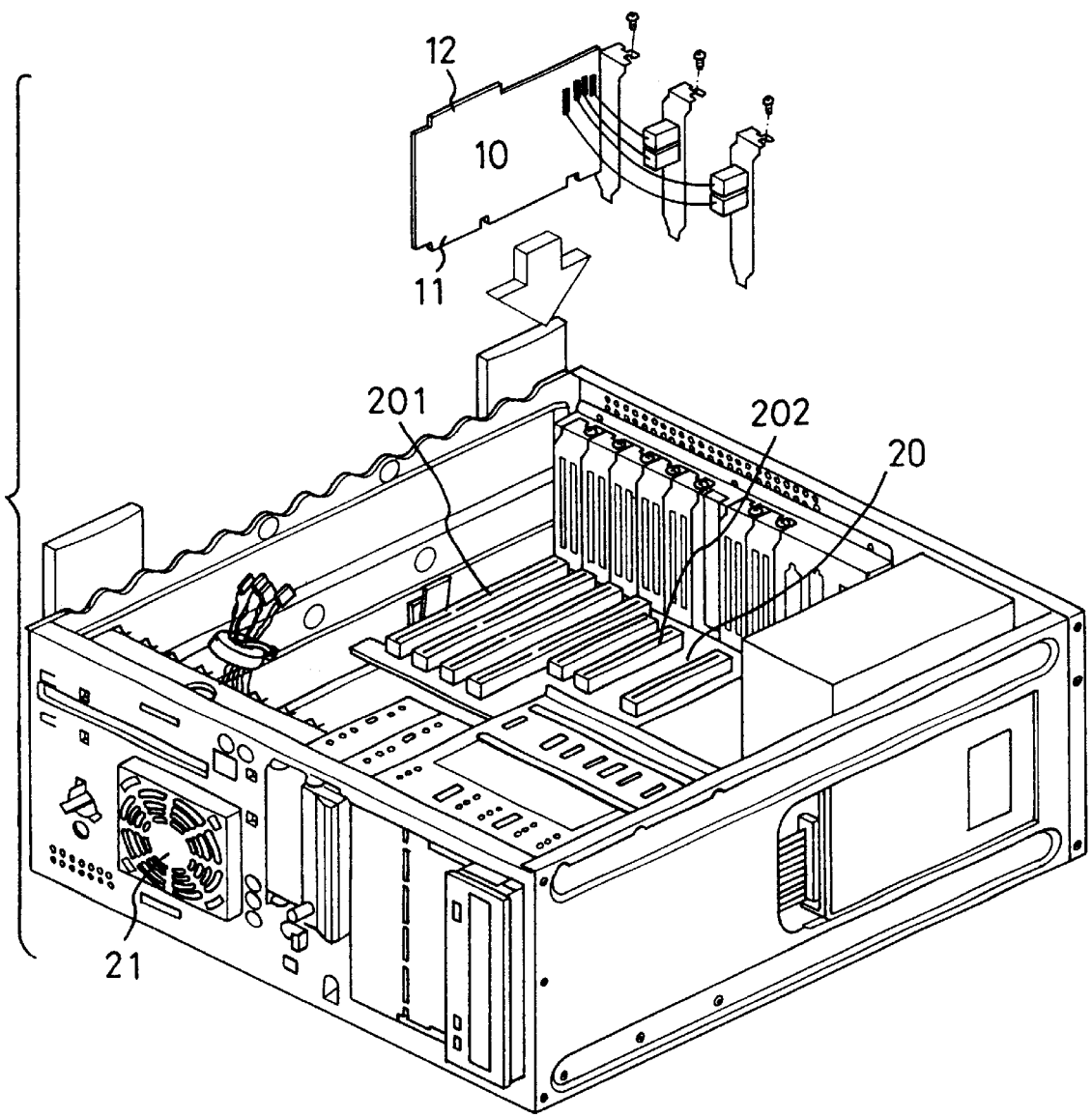
FIG. 1 is a schematic diagram showing the interface card-type in accordance with the present invention to be used in a computer.
Figure 2:
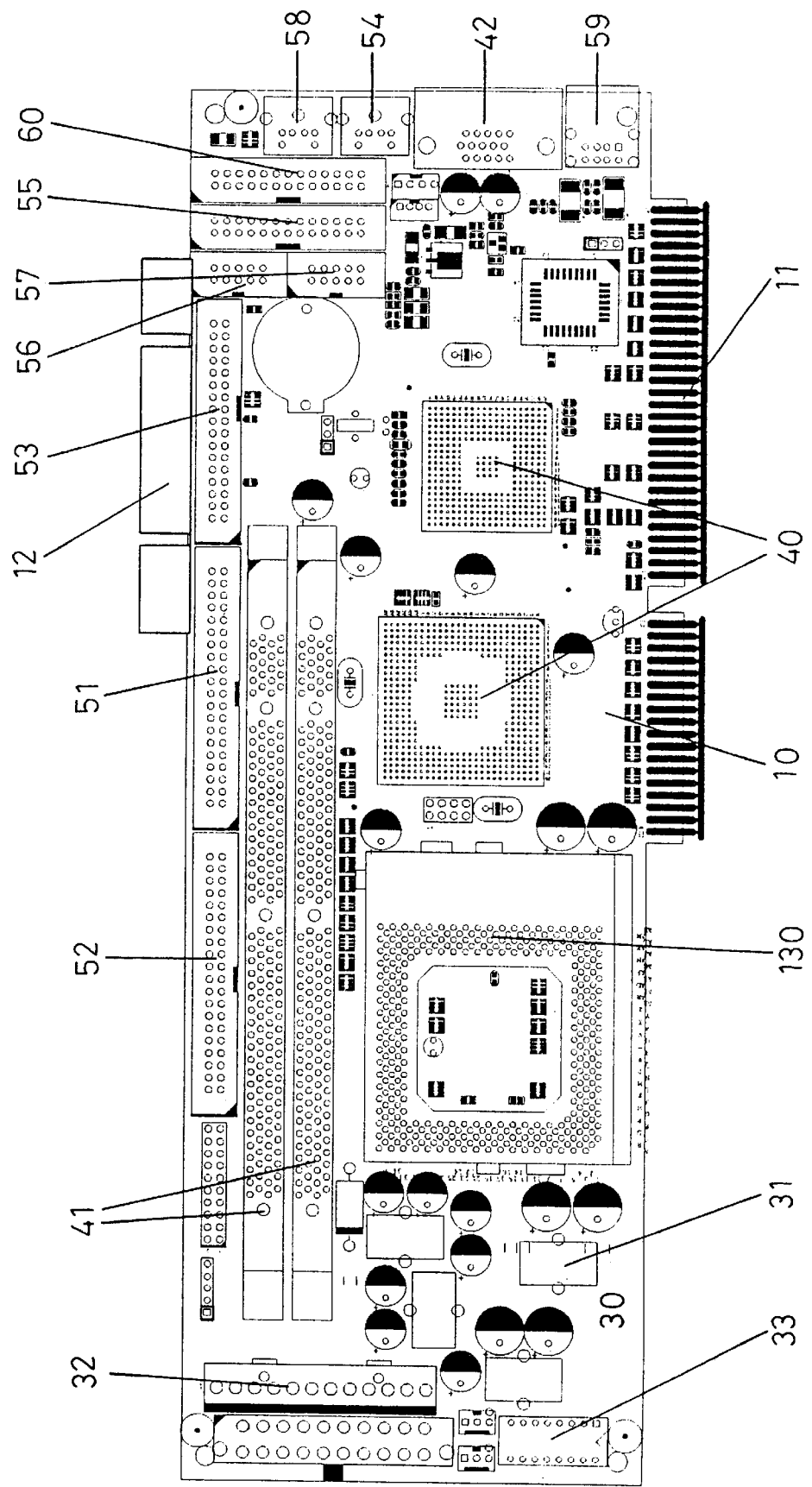
FIG. 2 is a flat view of the interface card-type of a preferred embodiment in accordance with the present invention.

As shown in FIG. 1, an interface card-type motherboad 10 in accordance with the present invention is to be plugged into an ISA socket 201 or a PCI socket 202 on the original motherboard 20 of a computer.

With reference to FIGS. 2–5, the interface card-type motherboard 10 has an ISA connector 11 and a PCI connector 12 formed in the form of finger connector. Accordingly, the interface card-type motherboard 10 can be directly applied to the original motherboard 20 by inserting the ISA connector 11 or tile PCI collector into the ISA socket 201 or PCI socket 202 on the original motherboard 20.

The interface card-type motherboard 10 comprises a CPU socket 13, a chipset 40, high-speed memory module connector 41, IDE connecting ports 51 and 52, floppy disk drive connecting port 53, parallel port 55, serial ports 56 and 57. USB port 58, sound connecting port 60, P/S mouse connecting port 54, VGA connecting port 42, keyboard connecting port 59 and a power device 30.

In the present embodiment, the high-speed memory module connector 41, IDE connecting ports 51 and 52, floppy disk drive connecting port 53, parallel polt 55, serial ports 56 and 57, and sound connecting port 60 are concentrated on an upper portion of the interface card-type motherboard 10. The USB port 58, P/S mouse connecting port 54, VGA connecting port 42, and keyboard connecting port 59 are concentrated on the right portion of the interface card-type motherboad 10 while the power device 30 is disposed on the left portion thereof The power device 30, which will be described in detail, comprises a power regulator 31, a power connector 32 and a DIP switch 33.

Figure 3:
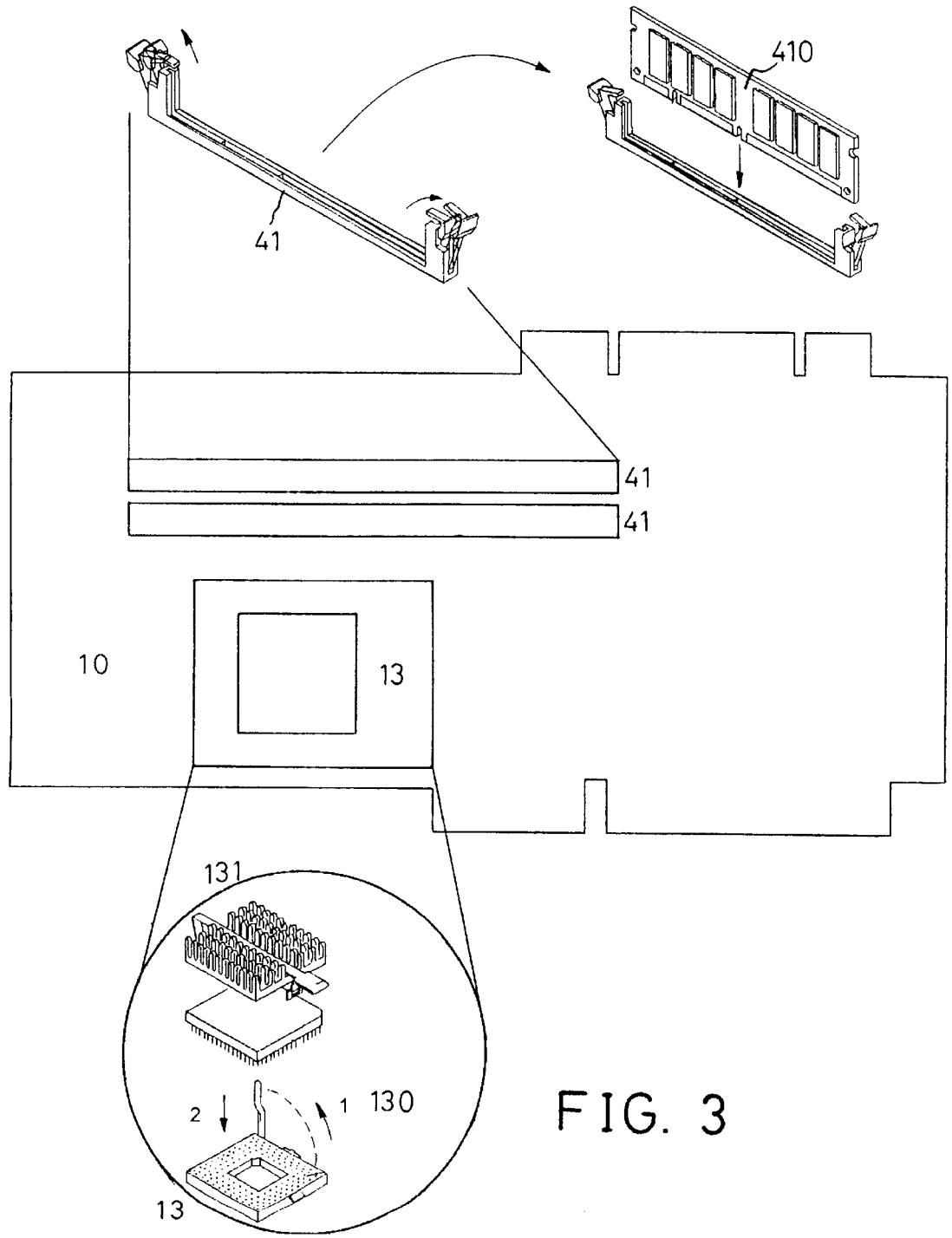
FIG. 3 shows the interface card-type of the preferred embodiment in accordance with the present invention using a high speed memory and CPU.

As shown in FIG. 3, the CPU socket 13 is a zero insert force (ZIF) connector for a CPU 130 to be plugged in. Then a fin 131 is mounted to the CPU 130. The high-speed memory module connector 41 is provided for a high-speed memory module.

Figure 4:
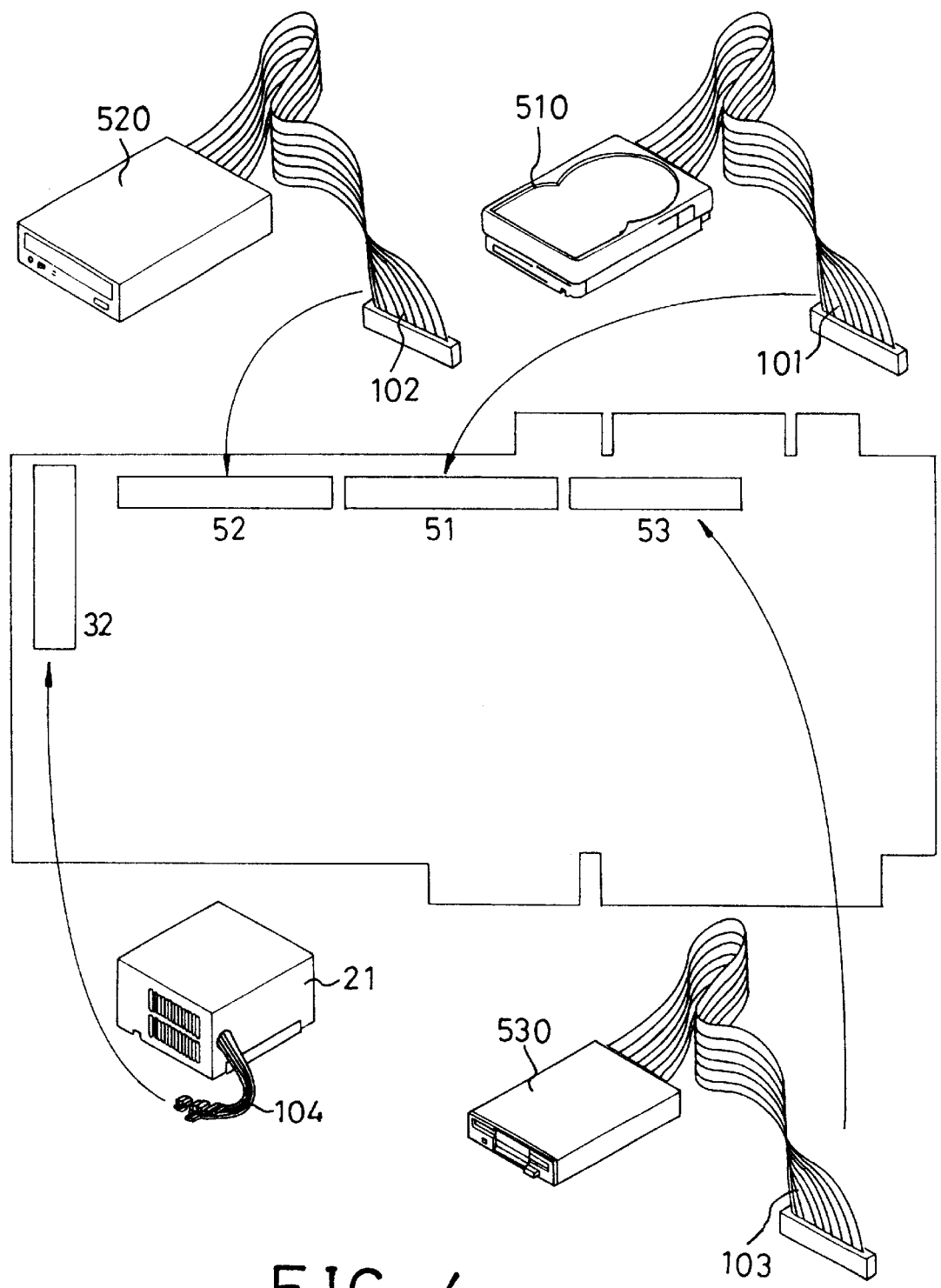
FIG. 4 shows the interface card-type of the preferred embodiment in accordance with the present invention connected with a hard disk drive, CD-ROM, power supply and floppy disk drive.

As shown in FIG. 4, a CD-ROM 520, hard disk drive 510 and floppy disk drive 530 are connected to the IDE connecting ports 52, 51 and floppy disk drive connecting port 53 through flat cables 102, 101 and 103, respectively. In addition, a power supply 21 of the computer is connected to the power connector 32 of the interface card-type motherboard 10 by a flat cable 104.

Figure 5:
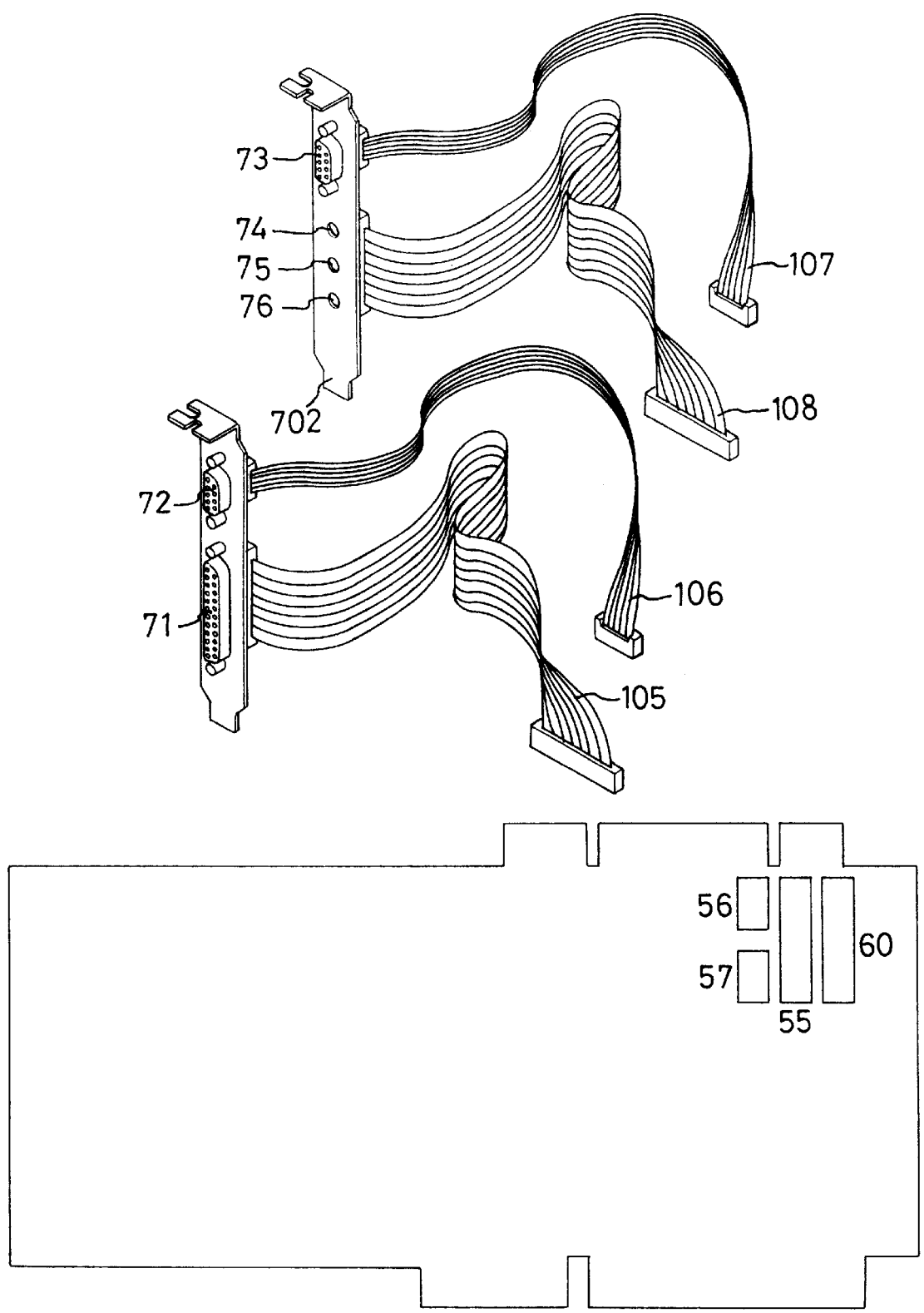
FIG. 5 shows the interface card-type motherboard of the preferred embodiment in accordance with the present invention connected to various connecting ports.

As shown in FIG. 5, the parallel port 55 of the interface card-type motherboard 10 is connected to a parallel port socket 71 by a parallel flat cable 105. The serial ports 56 and 57 are connected to serial sockets 72 and 73 by serial flat cables 106 and 107, respectively. The sound connecting port 60 is connected to a speaker socket 74, line in socket 75 and a microphone socket 76 through a sound flat cable 108. The parallel port socket 71, serial ports 72, 73, speaker socket 74, line in socket 75 and microphone socket 76 are disposed on two angular pieces 701, 702, which are mounted to the housing of the computer.

Figure 6:
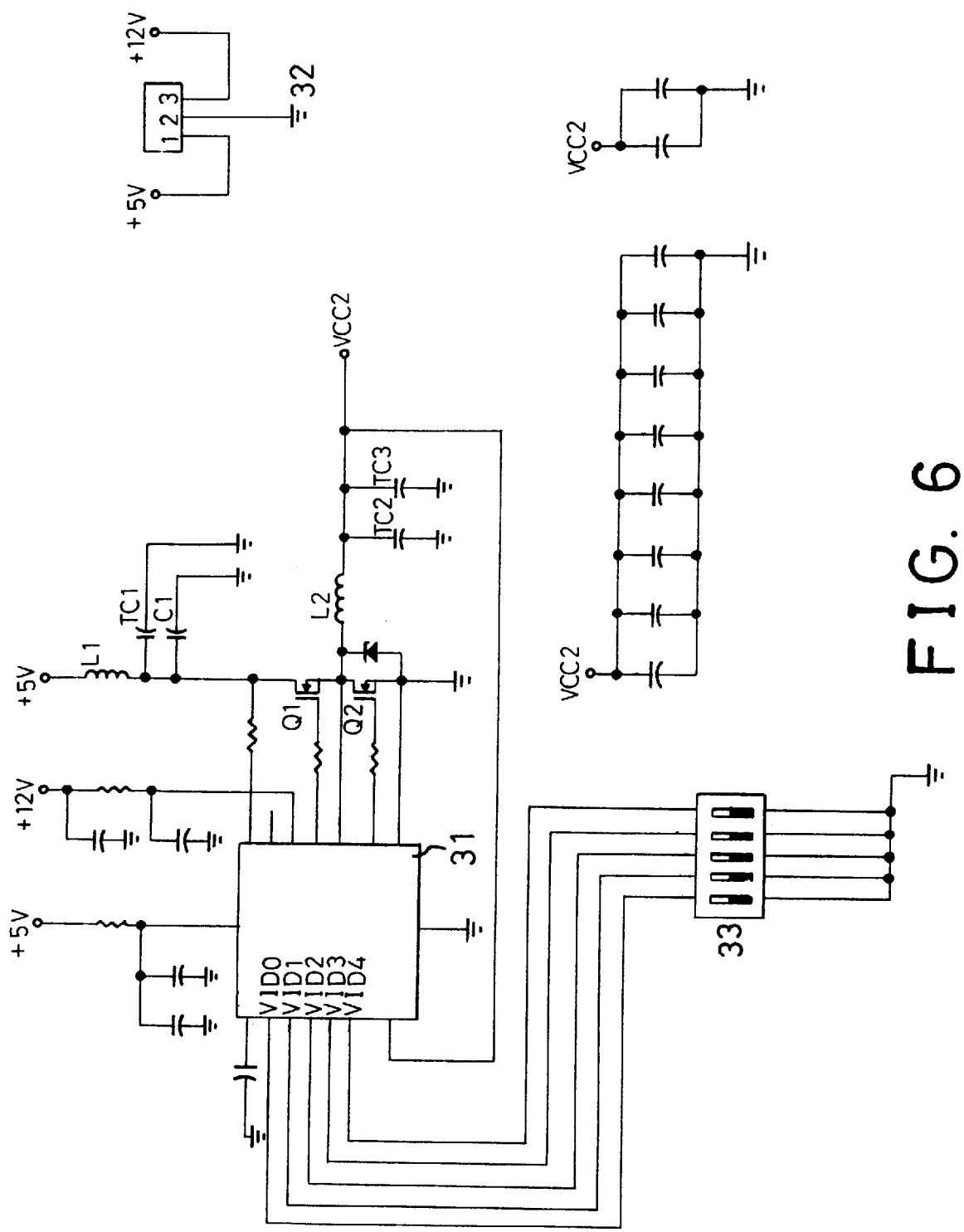
FIG. 6 is a circuit diagram of a power device of the interface card-type motherboard of the preferred embodiment in accordance with the present invention.

FIG. 6 shows the circuit of the power device 30 of the interface card-type motherboard 10 in accordance with the present invention. The power device 30 is separated from the motherboard 20 of the computer. The operation power of the interface card-type motherboard 10 is provided by the motherboard 20 of the computer, just as other interface cards. The power device receive the power output from the power supply 21 of the computer to convert the power into various voltages and then apply the voltages the elements on the interface card-type motherboard 10. The power device comprises a DIP switch 33 connected to input terminals VIDO-VID4 of the power regulator 31 so as to set the output voltage of the power regulator 31. The two output terminals of the power regulator 31 are connected with FET Q1 and Q2, respectively. The external power is fed into the power drive 30 through the power connector 32. The power from the power supply 21 is stabilized and filtered by an inductor L1 and capacitors TC1 and C1. The stabilized and filtered power is sent into a FET Q1. The output voltage of the FET Q1 is adjusted by the power regulator. A voltage VCC2 is generated by stabilizing and filtering the adjusted voltage through an inductor L2 and capacitors TC2 and TC3. The voltage VCC2 is the operating voltage for each of the chips and IC's on the interlace card-type motherboard 10.

In the power device 30, the DIP switch 33 is connected with the power regulator 31. Different feedback voltages are generated by switching the DIP switch 33, and therefore the voltage output from the terminal VCC2 of the power device 30 can be changed. Voltages in a range from 1.3V to 3.5V can be provided by switching of the DIP switch 33 The detailed values of the provided voltages are list in FIG. 7. It is noted that the table shown in FIG. 7 is for reference only. The power device 30 may be used to generate voltages of different values.

Figure 8:
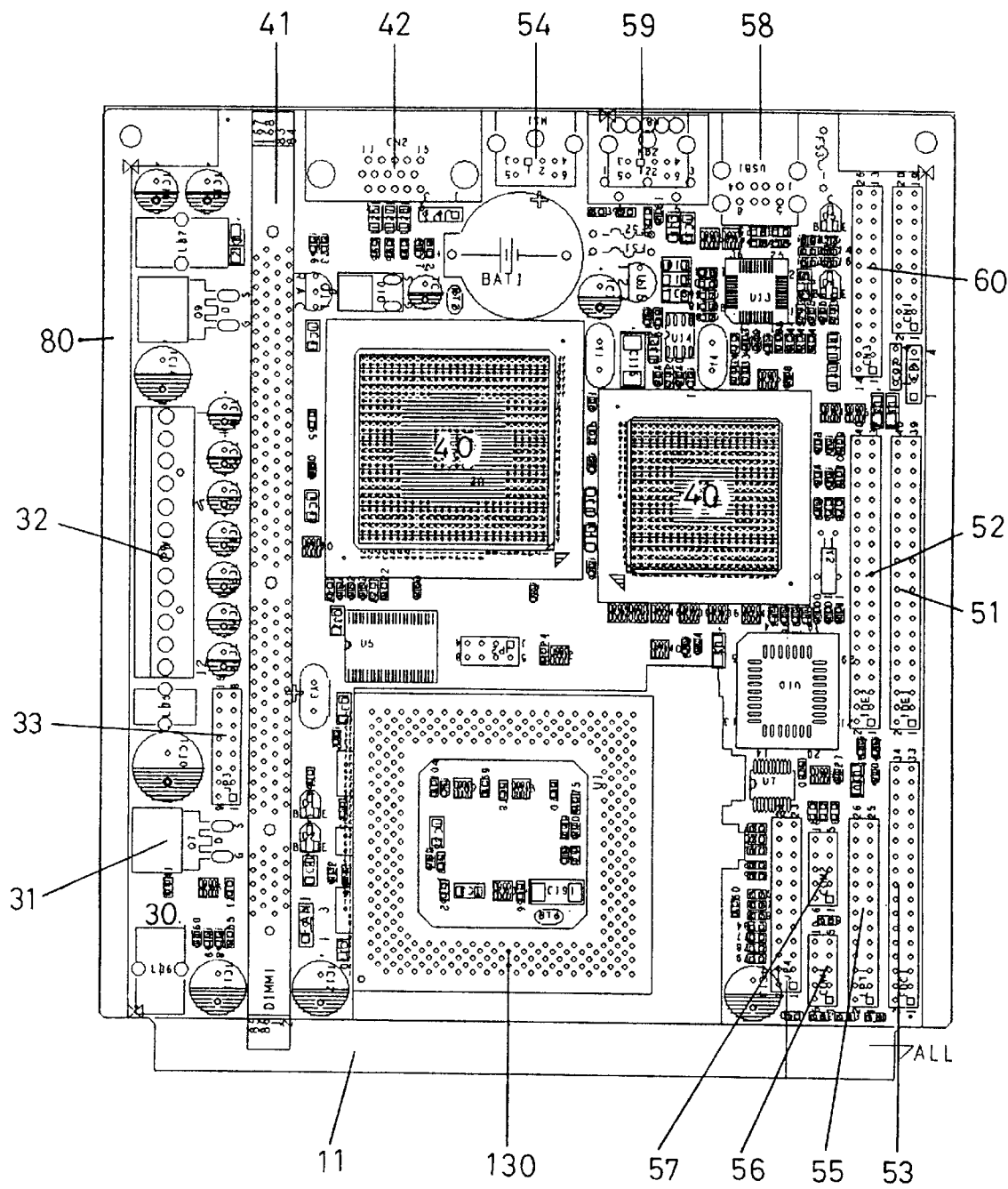
FIG. 8 is flat view of the interface card-type motherboard of another preferred embodiment in accordance with the present invention.

FIG. 8 shows another embodiment of the interface card-type motherboard in accordance with the present invention. The only difference between this embodiment and the above embodiment is that the motherboard 80 in this embodiment meets the specification of Japanese NIEC 98 series interface card.

As can be seen from the above descriptions, the interface card-type motherboard in accordance with the present invention has at least the advantages as follows:

(1) All old type computer can be upgraded by simply plugging the interface card-type motherboard to the original motherboard. Waste of resource is effectively avoided.

(2) The interface card-type motherboard has both ISA and PCI connectors, so that it can be used in various computer systems.

(3) The interface card-type motherboard has an individual power system, and is able to generate various operating voltages for different IC chips to use. Accordingly, to upgrade the CPU, chipset or other elements is performable.

Although the invention has been explained in relation to its preferred embodiment, it is to be understood that many other possible modifications and variations can be made without departing from the spirit and scope of the invention as hereinafter claimed.

What is claimed is:

1. A motherboard for a computer formed in a form of an interface card, said motherboard adapted to be plugged into an original motherboard of the computer to upgrade the computer, said motherboard having a CPU, chipset, high-speed memory module, connecting ports and a power device wherein the power device comprises a power regulator, a power connector and a DIP switch disposed at an input end of the power regulator, the power device provides various voltages by switching the DIP switch.

2. The motherboard as claimed in claim 1, wherein an ISA connector is disposed at a lower edge of the motherboard.

3. The motherboard as claimed in claim 2, wherein a PCI connector is disposed at an upper edge of the motherboard.

4. The motherboard as claimed in claim 1, wherein the motherboard further comprises a CPU socket, said CPU being plugged into the CPU socket.

5. The motherboard as claimed in claim 1, wherein the motherboard further comprises a high-speed memory module connector, said high-speed memory module being connected with the high-speed memory module connector.

6. The motherboard as claimed in claim 1, wherein the connecting ports comprise at least one IDE connecting port, floppy disk drive connecting port, parallel port, serial port, USB port, sound connecting port, P/S mouse connecting port, VGA connecting port and keyboard connecting port.

7. The motherboard as claimed in claim 1, wherein a PCI connector is disposed at a lower edge of the motherboard.

* * * * *